United States Patent
Choi et al.

(10) Patent No.: US 8,604,468 B1
(45) Date of Patent: Dec. 10, 2013

(54) ORGANIC LIGHT-EMITTING DISPLAY APPARATUS AND METHOD OF MANUFACTURING THE SAME

(71) Applicants: Sung-Soo Choi, Yongin (KR); Jae-Beom Choi, Yongin (KR); Yeoung-Jin Chang, Yongin (KR); Jae-Hwan Oh, Yongin (KR); Seong-Hyun Jin, Yongin (KR)

(72) Inventors: Sung-Soo Choi, Yongin (KR); Jae-Beom Choi, Yongin (KR); Yeoung-Jin Chang, Yongin (KR); Jae-Hwan Oh, Yongin (KR); Seong-Hyun Jin, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/667,022

(22) Filed: Nov. 2, 2012

(30) Foreign Application Priority Data

May 29, 2012 (KR) .......................... 10-2012-0056976

(51) Int. Cl.
*H01L 29/08* (2006.01)
(52) U.S. Cl.
USPC .......... 257/40; 257/72; 257/E51.006; 438/29; 438/99
(58) Field of Classification Search
USPC ................... 257/40, 72, E51.006; 438/29, 99
See application file for complete search history.

(56) References Cited

U.S. PATENT DOCUMENTS

2011/0309339 A1* 12/2011 You et al. .......................... 257/40
2012/0146031 A1*  6/2012 Lee ................... 257/59
2012/0313098 A1* 12/2012 Kim et al. ...................... 257/59

FOREIGN PATENT DOCUMENTS

KR   10-2000-0066157 A   11/2000
KR   10-2010-0112062 A   10/2010

* cited by examiner

*Primary Examiner* — Trung Q Dang
(74) *Attorney, Agent, or Firm* — Lee & Morse, P.C.

(57) ABSTRACT

An organic light-emitting display apparatus including an active layer and a first insulating layer on a substrate; a gate electrode on first insulating layer and including a first transparent conductive layer and a first metal layer, a second insulating layer on the gate electrode and including contact holes exposing source and drain areas of the active layer; source and drain electrodes including a second metal layer in the contact holes and on the second insulating layer, a pixel electrode on the first insulating layer and including the first transparent conductive layer, a reflection layer, and a second transparent conductive layer, and a pixel-defining layer on the source and drain electrodes and exposing the pixel electrode. The pixel-defining layer covers upper edges of the first transparent conductive layer of the pixel electrode. The reflection layer and the second transparent conductive layer contact sides of the pixel-defining layer.

19 Claims, 12 Drawing Sheets

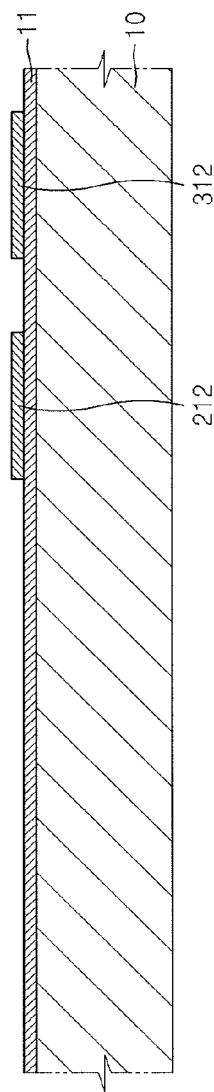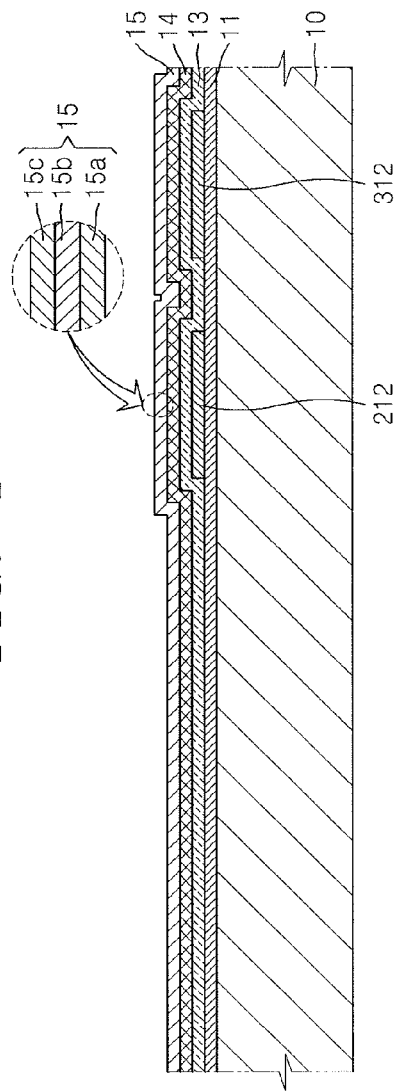

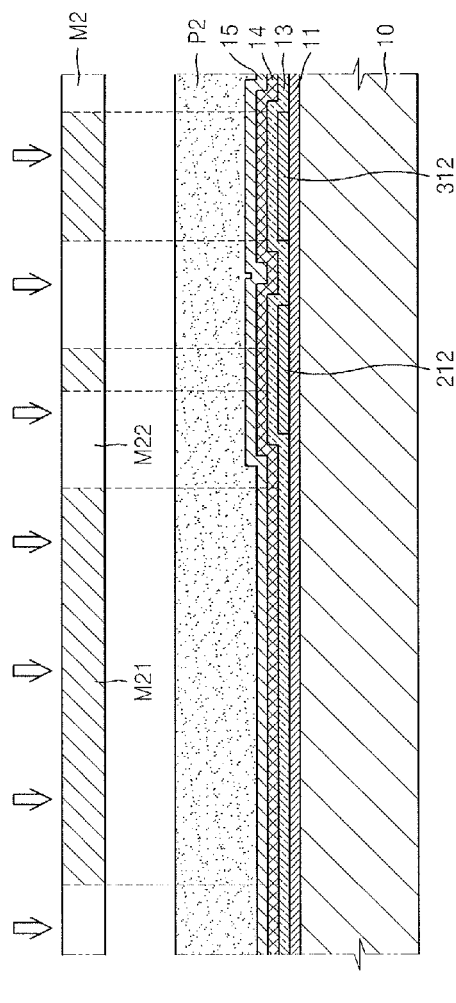
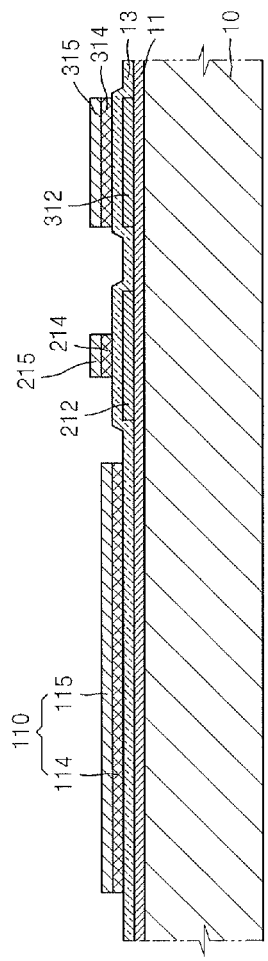
FIG. 5
FIG. 6

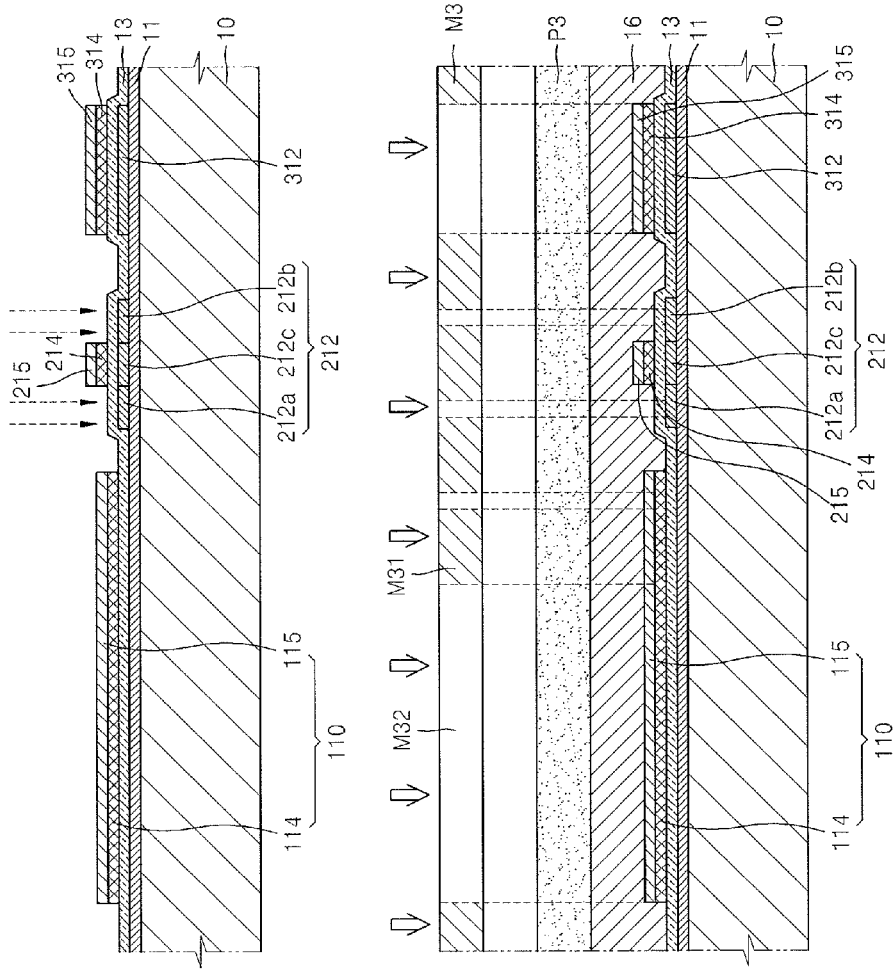

ORGANIC LIGHT-EMITTING DISPLAY APPARATUS AND METHOD OF MANUFACTURING THE SAME

CROSS-REFERENCE TO RELATED APPLICATION

This application claims the benefit under 35 U.S.C. §119 of Korean Patent Application No. 10-2012-0056976, filed on May 29, 2012, in the Korean Intellectual Property Office, the disclosure of which is incorporated herein in its entirety by reference.

BACKGROUND

1. Field

Embodiments are directed to an organic light-emitting display apparatus and a method of manufacturing the same.

2. Description of the Related Art

An organic light-emitting display apparatus is a self-emissive display apparatus including a positive electrode, a negative electrode, and a thin film that is disposed between the two electrodes and includes an organic emissive layer. When a voltage is applied to the thin film, electrons and holes recombine in the organic emissive layer so as to emit light.

The organic light-emitting display apparatus may be formed to be lightweight and thin. In addition, the organic light-emitting display apparatus may have a wide viewing angle, a fast response speed, and a low power consumption. Thus, the organic light-emitting display apparatus may be regarded as a next-generation display apparatus.

SUMMARY

Embodiments are directed to an organic light-emitting display apparatus including an active layer of a thin film transistor on a substrate, a gate electrode on the active layer and a first insulating layer, the gate electrode including a part of a first transparent conductive layer and a first metal layer; a second insulating layer on the gate electrode, the second insulating layer including contact holes exposing source and drain areas of the active layer, source and drain electrodes in the contact holes and on the second insulating layer, the source and drain electrodes including a second metal layer, a pixel electrode on the first insulating layer, the pixel electrode including another part of the first transparent conductive layer, a reflection layer, and a second transparent conductive layer, and a pixel-defining layer that exposes the pixel electrode, the pixel electrode being on the source and drain electrodes. The pixel-defining layer covers upper edges of the other part of the first transparent conductive layer in the pixel electrode, and the reflection layer and the second transparent conductive layer of the pixel electrode contact sides of the pixel-defining layer.

The reflection layer may include silver (Ag). The first and second transparent conductive layers may each include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The first and second metal layers may each include a plurality of metal layers. The first and second metal layers may be made of the same material. The first and second metal layers may include aluminum.

The organic light-emitting display apparatus may further include a capacitor including a first electrode made of a same material as the active layer due to being formed from a same layer as the active layer and a second electrode that is formed from the first transparent conductive layer, the second electrode being on the first insulating layer.

The organic light-emitting display apparatus may further include an intermediate layer on the pixel electrode, the intermediate layer including an organic emissive layer, and an opposite electrode facing the pixel electrode with the intermediate layer therebetween. The pixel electrode may partially transmit and partially reflect light emitted from the organic emissive layer. The opposite electrode may be a reflection mirror reflecting light emitted from the organic emissive layer.

Embodiments are also directed to a method of manufacturing an organic light-emitting display apparatus, including forming a semiconductor layer on a substrate and patterning the semiconductor layer to form an active layer of a thin film transistor; forming a first insulating layer, a first transparent conductive layer, and a first metal layer on the active layer, and forming a base layer of a pixel electrode and a gate electrode of the thin film transistor by patterning the first transparent conductive layer and the first metal layer; forming a second insulating layer on the base layer and the gate electrode and patterning the second insulating layer to form a first opening that exposes the base layer and to form contact holes that expose source and drain areas of the thin film transistor; forming a second metal layer in the first opening and the contact holes and patterning the second metal layer to form source and drain electrodes, and removing the first metal layer of the base layer that is exposed by the first opening; forming a third insulating layer in the first opening and the source and drain electrodes and patterning the third insulating layer to form a pixel-defining layer that exposes the first transparent conductive layer of the base layer; and forming a reflection layer and a second transparent conductive layer on the first transparent conductive layer of the base layer and the pixel-defining layer, and forming an upper layer of the pixel electrode on the first transparent conductive layer of the base layer by wet cleansing.

The wet cleansing may be performed by jetting a cleansing solution onto the reflection layer and the second transparent conductive layer. The cleansing solution may be de-ionized water (DI) water. A jet pressure of the cleansing solution may be about 0.1 to about 1 MPa.

The upper layer of the pixel electrode may contact a side of the pixel-defining layer.

After forming the gate electrode, the source and drain areas may be doped with ion impurities by using the gate electrode as a mask.

The method may further include, when forming the first opening and the contact hole, forming a via hole that passes through the second insulating layer.

The source and drain electrodes may be formed in the contact hole and the via hole at the same time.

When forming the active layer, a first electrode of a capacitor may be formed of a same material as the active layer due to being formed from the same layer as the active layer, and when forming the gate electrode, a second electrode of the capacitor may be formed from the first transparent conductive layer.

BRIEF DESCRIPTION OF THE DRAWINGS

Features will become more apparent by describing in detail exemplary embodiments thereof with reference to the attached drawings in which:

FIGS. 1 through 16 are schematic cross-sectional views illustrating stages of a method of manufacturing an organic light-emitting display apparatus, according to an embodiment.

DETAILED DESCRIPTION

Figure 1:
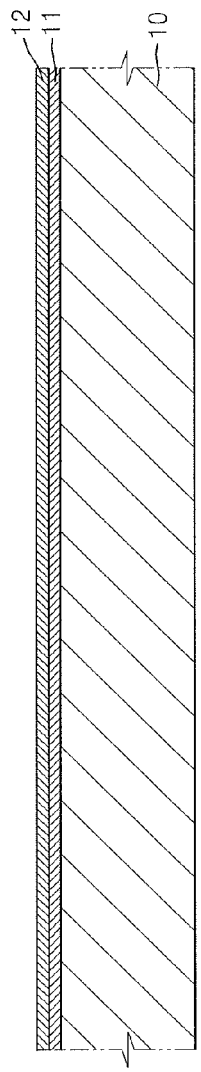

Embodiments will now be described more fully with reference to the accompanying drawings, in which exemplary embodiments of the invention are shown. As used herein, the term "and/or" includes any and all combinations of one or more of the associated listed items. Expressions such as "at least one of," when preceding a list of elements, modify the entire list of elements and do not modify the individual elements of the list.

In the drawings, each constituent element is exaggerated, omitted, or schematically illustrated for convenience of explanation and clarity. In addition, the size of each constituent element does not completely reflect an actual size, and in the present specification, when each constituent element is described as being formed "on" or "under" another constituent element, the constituent element may be formed "directly" or "indirectly" with any other constituent element interposed therebetween "on" or "under" the constituent element. The status of "on" or "under" of a constituent element may be understood with reference to the drawings.

FIGS. 1 through 16 are schematic cross-sectional views illustrating stages of a method of manufacturing an organic light-emitting display apparatus, according to an embodiment.

Referring to FIG. 1, a buffer layer 11 and a semiconductor layer 12 are sequentially formed on a substrate 10.

The substrate 10 may be formed of a transparent glass material including $SiO_2$ as a main component. In order to planarize the substrate 10 and to prevent penetration of impurity elements, the buffer layer 11, including $SiO_2$ and/or $SiN_x$, may be further formed on the substrate 10.

The buffer layer 11 and the semiconductor layer 12 may be deposited using various deposition methods such as a plasma-enhanced chemical vapor deposition (PECVD) method, an atmospheric pressure CVD (APCVD) method, or a low-pressure CVD (LPCVD) method.

The semiconductor layer 12 is deposited on the buffer layer 11. The semiconductor layer 12 may be amorphous silicon or polysilicon. Here, polysilicon may be formed by crystallizing amorphous silicon. Examples of methods of crystallizing amorphous silicon may be a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

Figure 2:
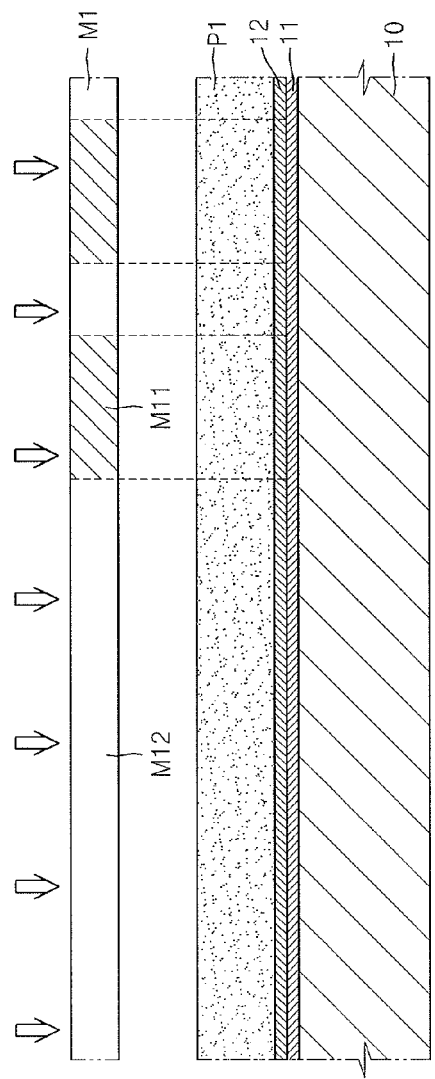

Referring to FIG. 2, a first photoresist P1 is coated on the semiconductor layer 12, and a first mask operation is performed using a first photomask M1 including a light-blocking unit M11 and a light-transmitting unit M12.

The first mask operation may include, after exposing the first photomask M1 using an exposure apparatus (not shown), a series of operations such as developing, etching, stripping, or ashing.

Referring to FIG. 3, as a result of the first photomask operation, the semiconductor layer 12 is formed into an active layer 212 of a thin film transistor. The semiconductor layer 12 is also patterned into a first electrode 312 of a capacitor that is formed from the same material layer as the active layer 212. FIGS. 2 and 3 illustrate using a positive lithography method in which portions corresponding to the light-transmitting units M12 are etched. However, in another implementation, a negative lithography method in which portions corresponding to the light-blocking units M11 are etched may be used. In subsequent operations of the method that use lithography, either a positive or negative lithography method may be used.

Next, as illustrated in FIG. 4, a first insulating layer 13, a first transparent conductive layer 14, and a first metal layer 15 are sequentially stacked on a resultant structure of FIG. 3.

The first insulating layer 13 may include a single layer or a plurality of layers of $SiO_2$, $SiN_x$, or the like. The first insulating layer 13 functions as a gate insulating layer of the thin film transistor and a dielectric layer of the capacitor.

The first transparent conductive layer 14 may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The first metal layer 15 may include at least one metal selected from the group of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu). For example, the first metal layer 15 may include aluminum (Al).

The first metal layer 15 may be formed using various suitable materials and various layers. For example, the first metal layer 15 may include a plurality of metal layers 15a, 15b, and 15c. The first metal layer 15 may be three-layer structure of Mo/Al/Mo in which the metal layers 15a and 15c formed of molybdenum (Mo) are formed respectively on and under the metal layer 15b, which may be formed of aluminum (Al).

Referring to FIG. 5, a second photoresist P2 is coated on the first metal layer 15, and a second mask operation is performed using a second photomask M2 including a light-blocking unit M21 and a light-transmitting unit M22.

As a result of the second mask operation, as shown in FIG. 6, a first transparent conductive layer 14 and a first metal layer 15 are respectively patterned into a base layer 110 including a first transparent conductive layer 114 and a first metal layer 115 of a pixel electrode, gate electrodes 214 and 215 of the thin film transistor, and second electrodes 314 and 315 of the capacitor.

Referring to FIG. 7, by using the gate electrodes 214 and 215, which are formed as a result of the second mask operation, as a self-aligned mask, the active layer 212 may be doped with ion impurities. As a result, the active layer 212 may include source and drain areas 212a and 212b that are doped with ion impurities and a channel area 212c disposed therebetween. That is, by using the gate electrodes 214 and 215 as a self-aligned mask, the source and drain area 212a and 212b may be formed without using an additional photomask.

Figure 9:
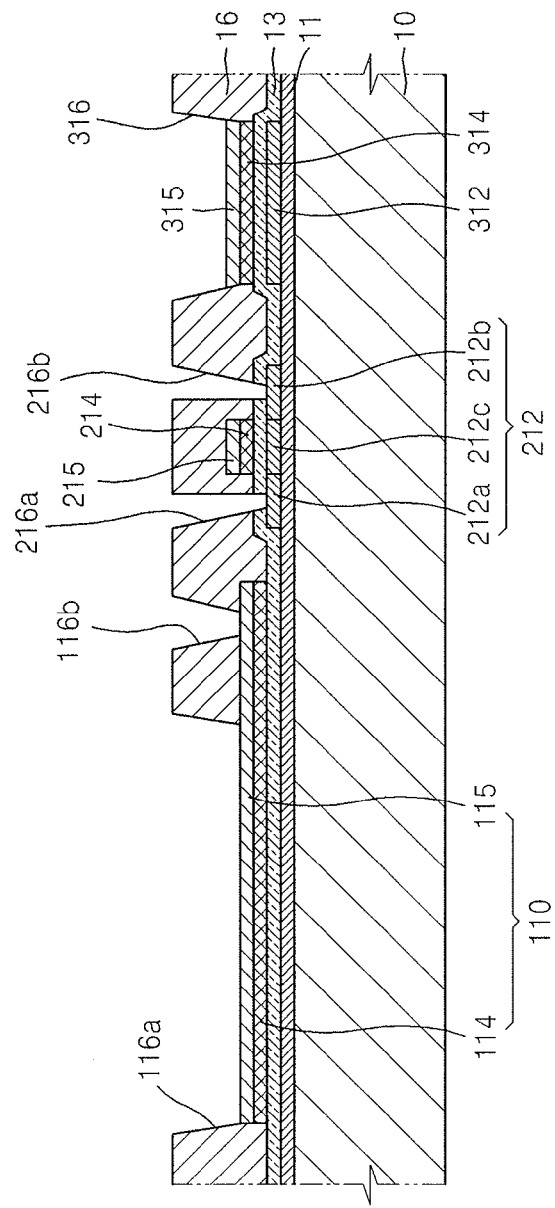

Next, as illustrated in FIG. 8, after coating a resultant product of the second mask operation with a second insulating layer 16 and a third photoresist P3, a third mask operation is performed using a third photomask M3 including a light-blocking unit M31 and a light-transmitting unit M32. Referring to FIG. 9, as a result of the third mask operation, a first opening 116a exposing the base layers 110 of the pixel electrode, contact holes 216a and 216b exposing the source and drain areas 212a and 212b of the thin film transistor, and a second opening 316 exposing the second electrodes 314 and 315 of the capacitor are formed in the second insulating layer 16.

In the third mask operation, a via hole 116b that passes through the second insulating layer 16 may be formed between the first opening 116a and the contact holes 216a and 216b.

Figure 10:
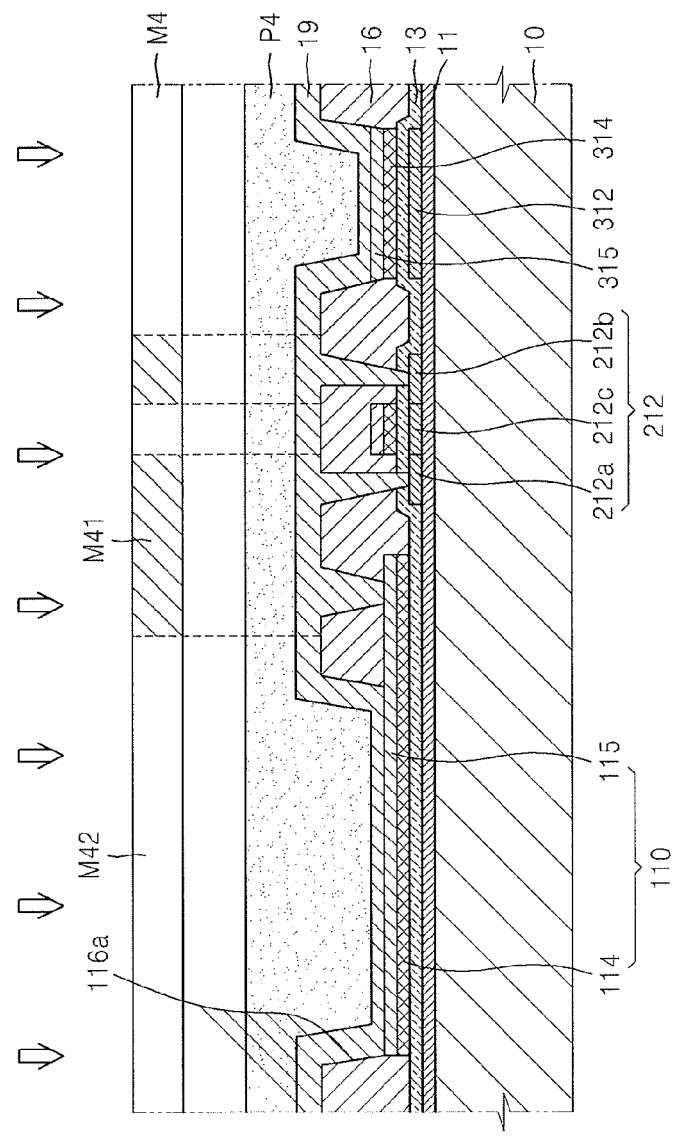
Figure 11:
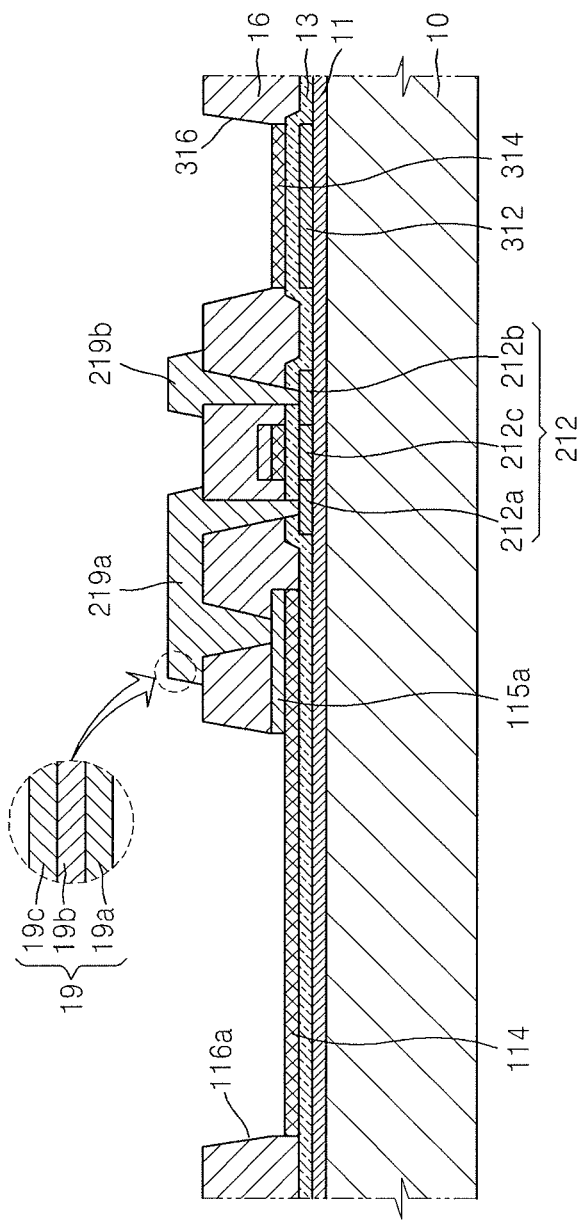

Next, referring to FIG. 10, a second metal layer 19 and a fourth photoresist P4 are formed on the resultant structure illustrated in FIG. 9, and a fourth mask operation is performed using a fourth photomask M4 including a light-blocking unit M41 and a light-transmitting unit M42. A result of the fourth mask operation is as illustrated in FIG. 11.

The second metal layer 19 may include at least one metal selected from the group of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu). For example, the second metal layer 19 may include aluminum (Al), like the first metal layer 15.

As a result of the fourth mask operation, the second metal layer 19 formed in the first opening 116a of the second insulating layer 16 and the first metal layer 115 of the base layer 110, which may have the same material as the second metal layer 19, are etched together and removed, and the first transparent conductive layer 114 of the base layer 110 is exposed. Similarly, the second metal layer 19 in the second opening 316 and the first metal layer 315 of the capacitor are etched together and removed.

The second metal layer 19 on the second insulating layer 16, in which the via hole 116b and contact holes 216a and 216b are formed, is formed into the source and drain electrodes 219a and 219b.

The source and drain electrodes 219a and 219b are filled in the via hole 116b and the contact holes 216a and 216b. The source electrode 219a contacts the first metal layer 115a and the source area 212a, and the drain electrode 219b contacts the drain area 212b.

Figure 12:
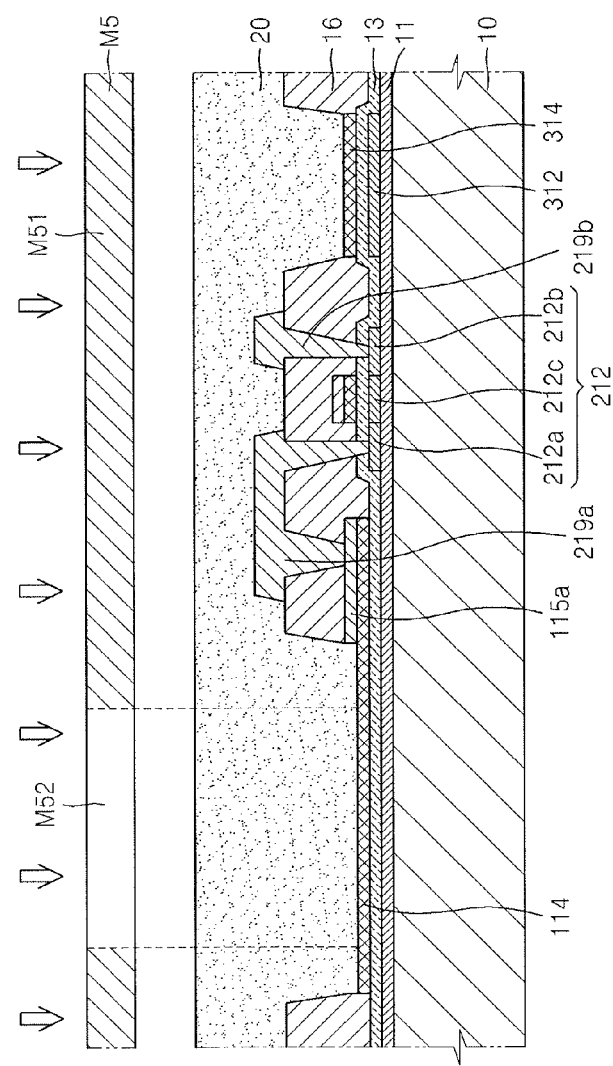

Next, as illustrated in FIG. 12, a third insulating layer 20 is formed on the resultant structure illustrated in FIG. 11, and a fifth mask operation is performed using a fifth photomask M5 including a light-blocking unit M51 and a light-transmitting unit M52. The third insulating layer 20 may be formed using an organic insulating layer or an inorganic insulating layer.

Figure 13:
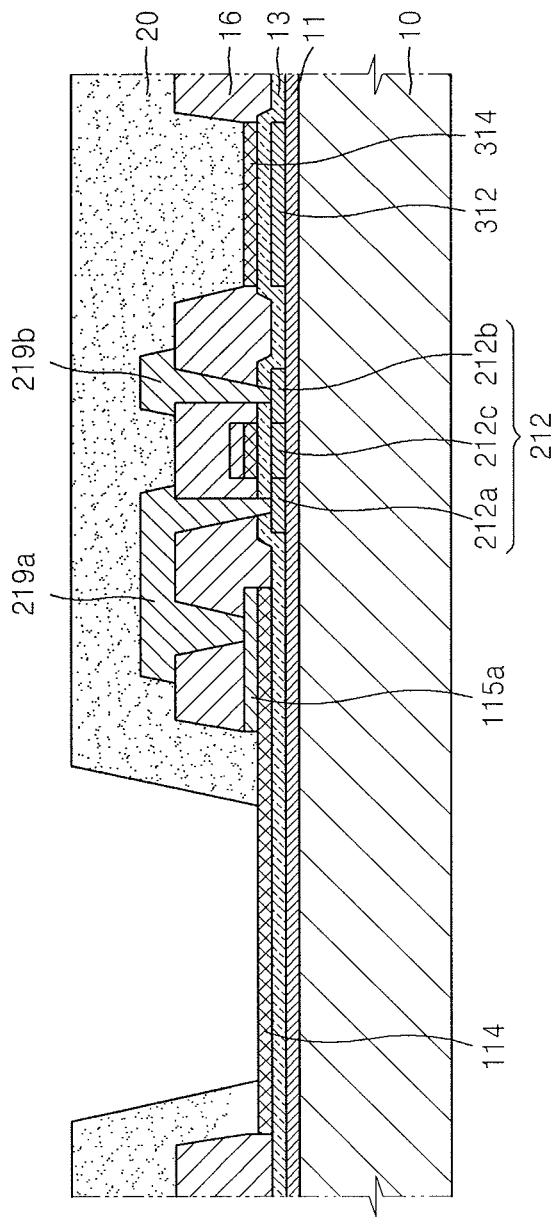

Referring to FIG. 13, as a result of the fifth mask operation, a pixel-defining layer (PDL) is formed on edges of the first transparent conductive layer 114 and on the source and drain electrodes 219a and 219b. The PDL exposes the first transparent conductive layer 114 of the pixel electrode.

Figure 14:
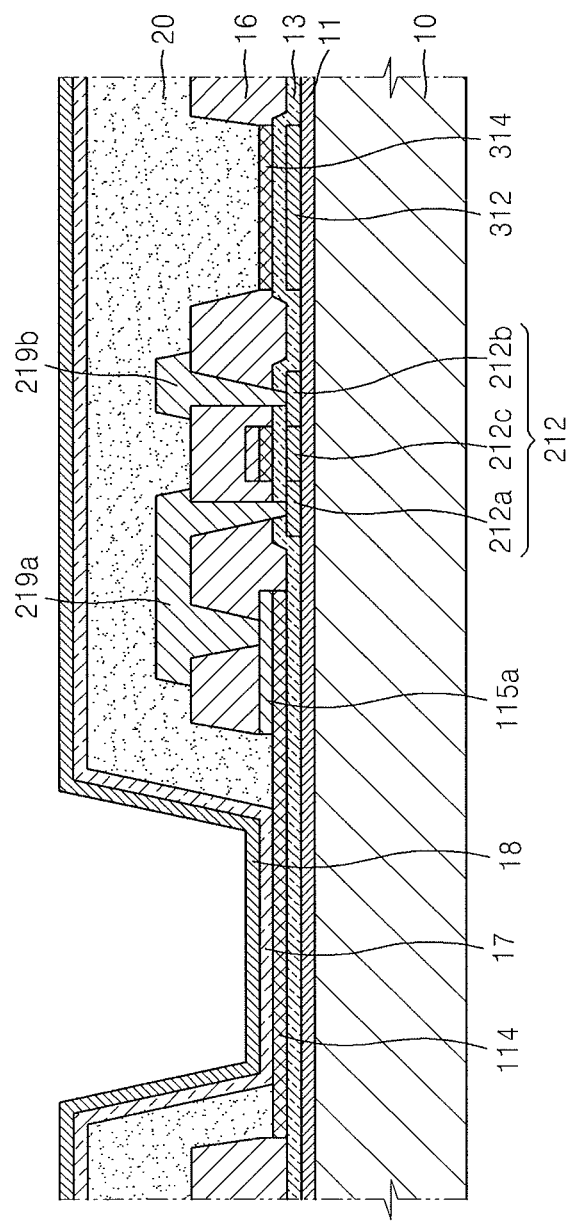

Next, as illustrated in FIG. 14, a reflection layer 17 and a second transparent conductive layer 18 are sequentially formed on the first transparent conductive layer 114 of the pixel electrode and the PDL, and then a wet cleansing operation is performed. The wet cleansing operation may be performed using a method of jetting a cleansing solution onto the reflection layer 17 and the second transparent conductive layer 18.

The reflection layer 17 includes silver (Ag) as a reflection material, and the second transparent conductive layer 18 may also include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO), like the first transparent conductive layer 14 described above.

Figure 15:
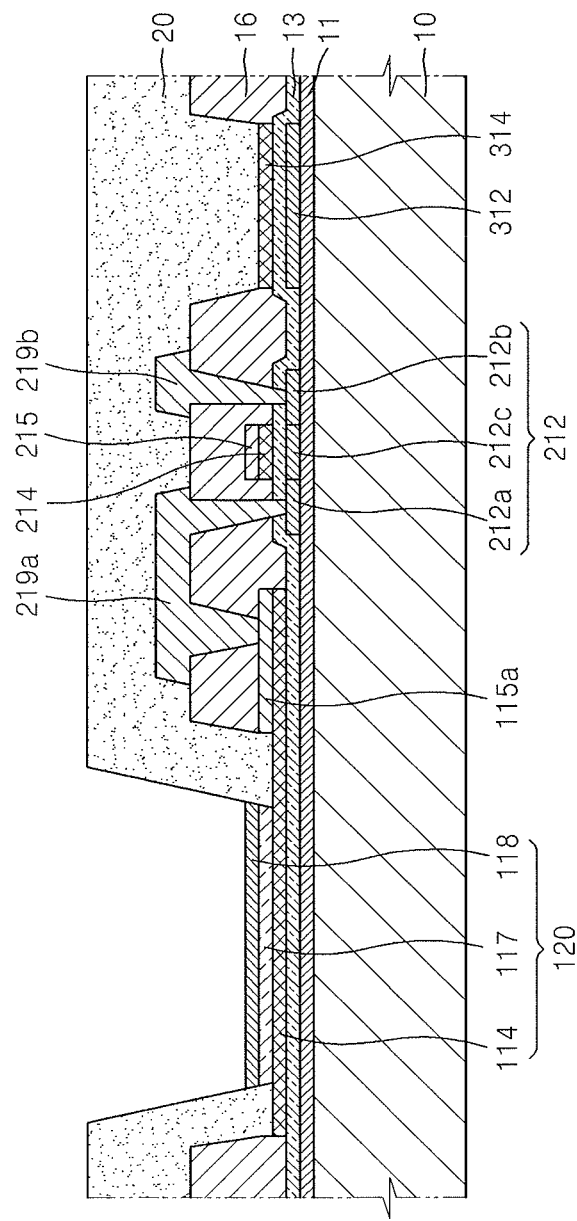

FIG. 15 illustrates a resultant structure after performing the wet cleansing operation. As a result of the wet cleansing operation in which a cleansing solution is jetted, the reflection layer 17 and the second transparent conductive layer 18 formed on the third insulating layer 20 are removed, and the reflection layer 17 and the second transparent conductive layer 18 formed on the first transparent conductive layer 114 remain as upper layers 117 and 118 of the pixel electrode 120.

Adhesive force between the reflection layer 17 including silver (Ag) and the first transparent conductive layer 114 including ITO or the like is greater than adhesive force between the reflection layer 17 and the third insulating layer 20, which is formed of an organic insulating layer or an inorganic insulating layer. Thus, only the reflection layer 17 and the second transparent conductive layer 18 formed on the third insulating layer 20 may be easily removed using a wet cleansing operation of jetting a cleansing solution.

The upper layers 117 and 118 of the pixel electrode 120 may be easily formed by using a difference in the adhesive force between the first transparent conductive layer 114 and the reflection layer 17 and the adhesive force between the reflection layer 17 and the third insulating layer 20. Accordingly, an additional mask operation for forming the upper layers 117 and 118 of the pixel electrode 120 may be omitted.

A jet pressure of the jetted cleansing solution may be in a range from about 0.1 to about 1 MPa. When the jet pressure of the cleansing solution is greater than 0.1 Mpa, the reflection layer 17 and the second transparent conductive layer 18 formed on the third insulating layer 20 may be properly removed. On the other hand, when the jet pressure of the cleansing solution is less than 1 Mpa, removal of the reflection layer 17 and the second transparent conductive layer 18 formed on the first transparent conductive layer 114 may be prevented. Thus, the jet pressure of the cleansing solution may preferably be in a range from about 0.1 to about 1 Mpa.

Any suitable solution with which the reflection layer 17 and the second transparent conductive layer 18 may be physically removed without causing an effect such as corrosion of the pixel electrode 120 when being in a contact with the cleaning solution may be used. For example, the cleansing solution may be de-ionized water (DI) water. DI water has an extremely low content of impurities, and thus, by performing a wet cleansing operation using DI water, penetration of impurities into the pixel electrode 120 may be prevented.

The upper layers 117 and 118 of the pixel electrode 120 formed as described above may be formed to contact a side of the PDL. By appropriately adjusting a thickness of the reflection layer 17, the upper layers 117 and 118 of the pixel electrode may transmit or reflect a portion of light. The upper layers 117 and 118 of the pixel electrode, which may transmit or reflect a portion of light, may be used as a semi-transmissive mirror of an organic light-emitting display apparatus including a light resonance structure.

Also, the upper layers 117 and 118 of the pixel electrode 120 functioning as a semi-transmissive mirror may be formed after the second mask operation in which the gate electrodes 214 and 215 and the base layer 110 of the pixel electrode 120 described above are formed and the third mask operation in which the first metal layer 115 of the base layer 110 is etched.

If the upper layers 117 and 118 of the pixel electrode 120 were to be formed in the second mask operation in which the gate electrodes 214 and 215 are formed, that is, if the gate electrode 214 in a lower portion were to be formed to further include the reflection layer 17 and the second transparent conductive layer 18, a total stacking thickness of the gate electrode could be increased. Thus, it could be difficult to form the gate electrodes 214 and 215 and wiring (not shown) connected to the gate electrodes 214 and 215.

Also, if the semi-transmissive mirror were to be formed below the first metal layer 115 of the base layer 110, in the third mask operation in which the first metal layer 115 of the base layer 110 is removed, the semi-transmissive mirror could be damaged by an etchant solution used to remove the first metal layer 115 of the base layer 110. In particular, when the semi-transmissive mirror includes silver (Ag), and the first metal layer 115 of base layer 110 includes aluminum (Al), as an example, damage to the semi-transmissive mirror due to an aluminum etching solution could be extensive. However, according to the embodiments, the semi-transmissive mirror is formed after forming the gate electrodes 214 and 215. Thus, damage to the semi-transmissive mirror due to an etching solution used to remove the first metal layer 115 of the base layer 110 may be prevented. Accordingly, a selection range of materials of the semi-transmissive mirror may be increased.

For example, in a bottom emission type display apparatus, the first transparent conductive layer 114 and the upper layers 117 and 118 of the pixel electrode may have a stack structure of, for example, ITO/Ag/IZO; on the other hand, in a top emission type display apparatus, the first transparent conductive layer 114 and the upper layers 117 and 118 of the pixel electrode may have a stack structure of, for example, ITO/Ag/Mo.

Figure 16:
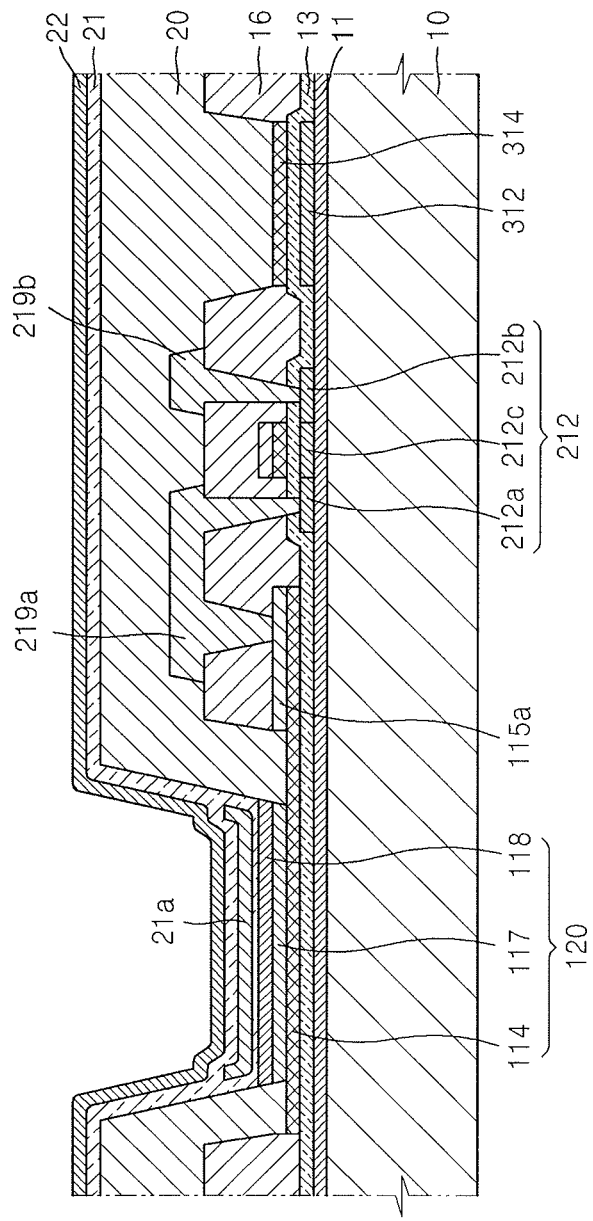

Referring to FIG. 16, an intermediate layer 21, including an organic emissive layer 21a, and an opposite electrode 22 are formed on the upper layers 117 and 118 of the pixel electrode 120.

The organic emissive layer 21a may be formed of a low molecular or polymer organic material.

When the organic emissive layer 21a is formed of a low molecular organic material, the intermediate layer 21 includes a hole transport layer (HTL) and hole injection layer (HIL) formed toward the pixel electrode 120, that is, toward the first transparent conductive layer 114 and the upper layers 117 and 118, and an electron transport layer (ETL) and an electron injection layer (EIL) toward opposite electrode 22. In addition, other various layers may be stacked as desired. Here, examples of organic materials that may be used include copper phthalocyanine (CuPc), N,N'-di(naphthalene-1-yl)-N,N'-diphenyl-benzidine: (NPB), and tris-8-hydroxyquinoline aluminum (Alq3).

When the organic emissive layer 21a is formed of a polymer organic material, only an HTL may be included toward the pixel electrode 120 with respect to the organic emissive layer 21a. The HTL may be formed of, for example, poly-(3, 4)-ethylene-dihydroxy thiophene (PEDOT) or polyaniline (PANI) using an inkjet printing method or a spin coating method. Examples of organic materials used here include polymer organic materials such as poly-phenylenevinylene (PPV) and polyfluorene. Color patterns may be formed using a typical method such as an inkjet printing method, a spin coating method, or a heat transfer method using laser.

The intermediate layer 21 including the organic emissive layer 21a may be formed such that a thickness of the organic emissive layer 21a varies or thicknesses of other organic layers (not shown) included in the intermediate layer 21 except the organic emissive layer 21a vary to form a light resonance structure.

The opposite electrode 22 is deposited on the intermediate layer 21 as a common electrode. For example, the pixel electrode 120 may be an anode electrode, and the opposite electrode 22 may be a cathode electrode. However, in other implementations, the polarities of the electrodes may be reversed.

In addition, to form a light resonance structure, the opposite electrode 22 is formed as a reflection electrode including a reflection material and may function as a reflection mirror reflecting light emitted from the organic emissive layer 21a.

The opposite electrode 22 may include at least one material selected from the group of Al, Mg, Li, Ca, LiF/Ca, and LiF/Al.

Although not illustrated in FIG. 16, an encapsulation member (not shown) and a moisture absorbing agent (not shown) protecting the organic light emissive layer 21a from water or oxygen from the outside may be further included.

By way of summation and review, an organic light-emitting display apparatus that forms full colors may include a light resonance structure that changes wavelengths of light emitted from an organic emissive layer of pixels of various colors (e.g., red, green, and blue pixels).

Embodiments may provide an organic light-emitting display apparatus in which a pixel electrode having a resonance structure may be easily formed, and a method of manufacturing the organic light-emitting display apparatus. For example, a reflection layer and a second transparent conductive layer, which are upper layers of a pixel electrode, may be formed using a wet cleansing operation such that the pixel electrode having a resonance structure may be easily formed.

Also, the reflection layer and the second transparent conductive layer may be formed after forming a gate electrode. Accordingly, damage to a semi-transmissive mirror due to an etchant solution used to form a gate electrode may be prevented or reduced, and a selection range of materials may be increased.

While embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. An organic light-emitting display apparatus, comprising:
    an active layer of a thin film transistor on a substrate;
    a gate electrode on the active layer and a first insulating layer, the gate electrode including a part of a first transparent conductive layer and a first metal layer;
    a second insulating layer on the gate electrode, the second insulating layer including contact holes exposing source and drain areas of the active layer;
    source and drain electrodes in the contact holes and on the second insulating layer, the source and drain electrodes including a second metal layer;
    a pixel electrode on the first insulating layer, the pixel electrode including another part of the first transparent conductive layer, a reflection layer, and a second transparent conductive layer; and
    a pixel-defining layer that exposes the pixel electrode, the pixel-defining layer being on the source and drain electrodes,
    wherein:
    the pixel-defining layer covers upper edges of the part of the first transparent conductive layer in the pixel electrode, and
    the reflection layer and the second transparent conductive layer of the pixel electrode contact sides of the pixel-defining layer.

2. The organic light-emitting display apparatus of claim 1, wherein the reflection layer includes silver (Ag).

3. The organic light-emitting display apparatus of claim 1, wherein the first and second transparent conductive layers include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

4. The organic light-emitting display apparatus of claim 1, wherein the first and second metal layers each include a plurality of metal layers.

5. The organic light-emitting display apparatus of claim 1, wherein the first and second metal layers are made of a same material.

6. The organic light-emitting display apparatus of claim 1, wherein the first and second metal layers include aluminum.

7. The organic light-emitting display apparatus of claim 1, further comprising:
- a capacitor including a first electrode made of a same material as the active layer due to being formed from a same layer as the active layer, and
- a second electrode that is formed from the first transparent conductive layer, the second electrode being on the first insulating layer.

8. The organic light-emitting display apparatus of claim 1, further comprising:
- an intermediate layer on the pixel electrode, the intermediate layer including an organic emissive layer, and
- an opposite electrode facing the pixel electrode with the intermediate layer therebetween.

9. The organic light-emitting display apparatus of claim 8, wherein the pixel electrode partially transmits and partially reflects light emitted from the organic emissive layer.

10. The organic light-emitting display apparatus of claim 8, wherein the opposite electrode is a reflection mirror reflecting light emitted from the organic emissive layer.

11. A method of manufacturing an organic light-emitting display apparatus, the method comprising:
- forming a semiconductor layer on a substrate, and patterning the semiconductor layer to form an active layer of a thin film transistor;
- forming a first insulating layer, a first transparent conductive layer, and a first metal layer on the active layer, and forming a base layer of a pixel electrode and a gate electrode of the thin film transistor by patterning the first transparent conductive layer and the first metal layer;
- forming a second insulating layer on the base layer and the gate electrode, and patterning the second insulating layer to form a first opening that exposes the base layer and to form contact holes that expose source and drain areas of the thin film transistor;
- forming a second metal layer in the first opening and the contact holes, patterning the second metal layer to form source and drain electrodes, and removing the first metal layer of the base layer that is exposed by the first opening;
- forming a third insulating layer in the first opening and the source and drain electrodes, and patterning the third insulating layer to form a pixel-defining layer that exposes the first transparent conductive layer of the base layer; and
- forming a reflection layer and a second transparent conductive layer on the first transparent conductive layer of the base layer and the pixel-defining layer, and forming an upper layer of the pixel electrode on the first transparent conductive layer of the base layer by wet cleansing.

12. The method of claim 11, wherein the wet cleansing is performed by jetting a cleansing solution onto the reflection layer and the second transparent conductive layer.

13. The method of claim 12, wherein the cleansing solution is de-ionized water (DI) water.

14. The method of claim 12, wherein a jet pressure of the cleansing solution is about 0.1 to about 1 MPa.

15. The method of claim 11, wherein the upper layer of the pixel electrode contacts a side of the pixel-defining layer.

16. The method of claim 11, wherein after forming the gate electrode, the source and drain areas are doped with ion impurities by using the gate electrode as a mask.

17. The method of claim 11, further comprising, when forming the first opening and the contact hole, forming a via hole that passes through the second insulating layer.

18. The method of claim 17, wherein the source and drain electrodes are formed in the contact hole and the via hole at the same time.

19. The method of claim 11, wherein:
- when forming the active layer, a first electrode of a capacitor is formed of a same material as the active layer due to being formed from the same layer as the active layer, and
- when forming the gate electrode, a second electrode of the capacitor is formed from the first transparent conductive layer.

* * * * *